(12) United States Patent
Nagrodsky et al.

(10) Patent No.: US 10,710,617 B2
(45) Date of Patent: Jul. 14, 2020

(54) CONTROL AND MONITORING DEVICE FOR A SWITCH MACHINE, A SYSTEM AND METHOD FOR MONITORING A SWITCH MACHINE

(71) Applicant: ALSTOM Transport Technologies, Saint-Ouen (FR)

(72) Inventors: Nicholas Nagrodsky, Melbourne, FL (US); Michael Carter, Melbourne, FL (US); Jeffrey Fries, Grain Valley, MO (US)

(73) Assignee: ALSTOM Transport Technologies, Saint-Ouen (FR)

( * ) Notice: Subject to any disclaimer, the term of this patent is extended or adjusted under 35 U.S.C. 154(b) by 371 days.

(21) Appl. No.: 15/685,397

(22) Filed: Aug. 24, 2017

(65) Prior Publication Data

US 2019/0061792 A1 Feb. 28, 2019

(51) Int. Cl.

| | |
|---|---|
| *G01R 5/10* | (2006.01) |
| *B61L 5/10* | (2006.01) |
| *G01R 21/08* | (2006.01) |
| *B61L 23/04* | (2006.01) |
| *B61L 5/06* | (2006.01) |

(52) U.S. Cl.
CPC ............... *B61L 5/107* (2013.01); *B61L 5/067* (2013.01); *B61L 23/04* (2013.01); *G01R 21/08* (2013.01)

(58) Field of Classification Search
CPC .......... B61L 5/067; B61L 23/04; G01R 21/08
See application file for complete search history.

(56) References Cited

U.S. PATENT DOCUMENTS

| | | | | |
|---|---|---|---|---|
| 5,142,235 | A * | 8/1992 | Matsumoto | H03K 17/9502 324/236 |
| 5,418,453 | A * | 5/1995 | Wise | G01P 3/488 324/160 |
| 5,504,405 | A * | 4/1996 | Hager | B61L 5/062 318/400.01 |
| 6,484,974 | B1 * | 11/2002 | Franke | B61L 5/107 246/220 |
| 9,397,593 | B2 * | 7/2016 | Kato | H02P 29/40 |
| 2017/0275799 | A1 * | 9/2017 | Chen | D05B 69/18 |

* cited by examiner

*Primary Examiner* — Alvaro E Fortich
(74) *Attorney, Agent, or Firm* — Troutman Sanders LLP

(57) ABSTRACT

The invention concerns a control and monitoring device for a switch machine of a railway switch comprising: a power supply for providing a switch motor of the switch machine with a current, the switch motor being adapted to move points of the railway switch, a relay having a primary contact connected electrically to the power supply via at least one line and a secondary contact adapted to be electrically connected to the switch motor; the relay being adapted to switch on and off the power provided to the switch motor; at least one current sensor adapted to sense the current to be provided to the switch motor at the at least one line between the power supply and the relay; at least one voltage sensor adapted to sense a voltage to be provided to the switch motor at the at least one line between the power supply and the relay; a monitoring module connected to the at least one current sensor and the at least one voltage sensor, wherein the monitoring module is adapted to record the measured current and voltage values.

19 Claims, 2 Drawing Sheets

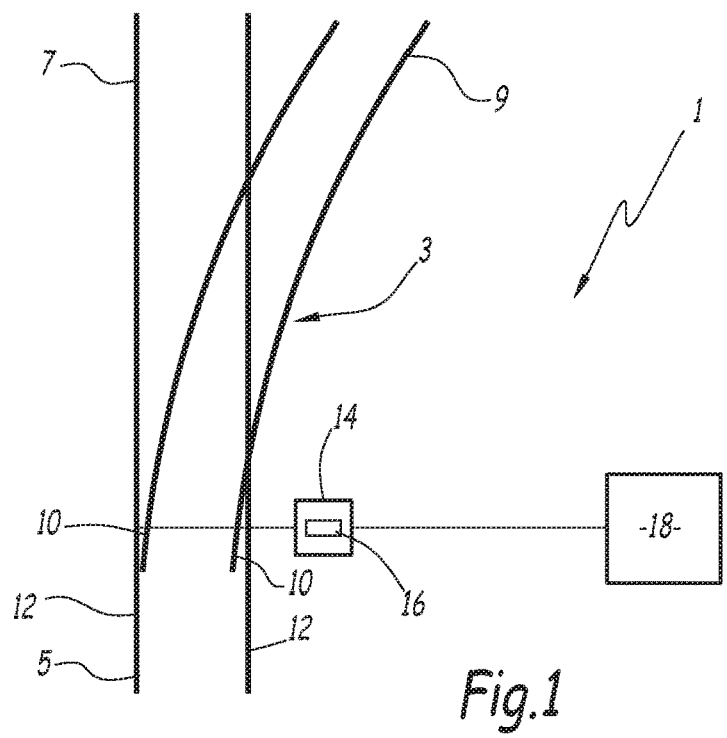
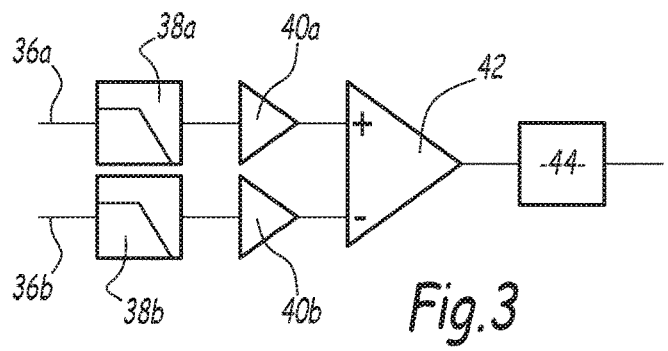
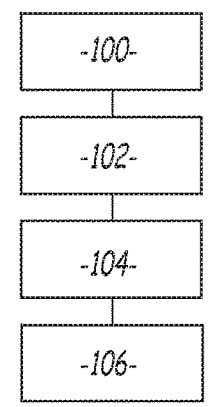
Fig.1
Fig.3
Fig.4

CONTROL AND MONITORING DEVICE FOR A SWITCH MACHINE, A SYSTEM AND METHOD FOR MONITORING A SWITCH MACHINE

The present invention concerns a control and monitoring device for a switch machine of a railway switch comprising a power supply for providing a switch motor of the switch machine with a current, the switch motor being adapted to move points of the railway switch.

According to another aspect, the present invention concerns a system comprising a railway switch having a switch machine including a switch motor, the switch motor being adapted to move points of the railway switch between a first position and a second position; and a control and monitoring device for a switch machine of a railway switch.

Further, the present invention concerns a method for monitoring a switch machine, wherein a power supply is providing a current to a switch motor of the switch machine, the switch motor being adapted to move points of the railway switch.

CN 201804054 relates to a failure detection system for an alternating-current switch machine, which comprises a current sampling device, a voltage sampling device and a failure analysis module.

Object of the invention is to provide an improved control and monitoring device for a switch machine and that does not interfere with the switch machine performance.

According to an aspect, a control and monitoring device is provided for a switch machine of a railway switch comprising:
a power supply for providing a switch motor of the switch machine with a current, the switch motor being adapted to move points of the railway switch,
a relay having a primary contact connected electrically to the power supply via at least one line and a secondary contact adapted to be electrically connected to the switch motor; the relay being adapted to switch on and off the power provided to the switch motor;
at least one current sensor adapted to sense the current to be provided to the switch motor at the at least one line between the power supply and the relay;
at least one voltage sensor adapted to sense a voltage to be provided to the switch motor at the at least one line between the power supply and the relay;
a monitoring module connected to the at least one current sensor and the at least one voltage sensor, wherein the monitoring module is adapted to record the measured current and voltage values.

Embodiments of the invention may include the following features, which may be combined in any feasible combination:
the current sensor is electrically connected to a current transducer adapted to detect the current to be provided;
the current transducer is galvanically separated from the at least one line between the power supply and the relay;
the current transducer is a Hall Effect sensor;
the current transducer is adapted to provide a voltage corresponding to the current flowing in the at least one line;
the voltage sensor includes at least one galvanic separation to separate the at least one line from the monitoring module
the galvanic separation is a voltage isolation amplifier;
the relay is adapted to switch the polarity of the power supply;
the control and monitoring device further includes a controller adapted to control the relay;
the control and monitoring device is adapted to be arranged remotely from the railway switch; and/or
the relay includes at least one control contact, the at least one control contact being adapted to be connected to a controller adapted to control the relay with an input voltage, wherein the at least one control contact is connected to the monitoring module at a respective input, wherein the monitoring module is adapted to record the values provided by the at least one current sensor and the at least one voltage sensor in response to detecting a change of the input voltage.

According to an aspect, the system comprising a railway switch having a switch machine including a switch motor, the switch motor being adapted to move points of the railway switch between a first position and a second position; and a control and monitoring device for a switch machine of a railway switch including:
a power supply adapted to provide the switch motor with a DC current,
a relay having a primary contact connected electrically to the power supply via at least one line and a secondary contact being electrically connected to the switch motor, the relay being adapted to switch on and off the power provided to the switch motor;
at least one current sensor adapted to sense the current to be provided to the switch motor at the at least one line between the power supply and the relay;
at least one voltage sensor adapted to sense a voltage to be provided to the switch motor at the at least one line between the power supply and the relay;
a monitoring module connected to the at least one current sensor and the at least one voltage sensor, wherein the monitoring module is adapted to record the measured current and voltage values.

Embodiments of the invention may include the following features, which may be combined in any feasible combination:
the current sensor is electrically connected to a current transducer adapted to detect the current to be provided;
the current transducer is galvanically separated from the at least one line between the power supply and the relay;
the voltage sensor includes at least one galvanic separation to separate the at least one line from the monitoring module.
the relay is adapted to switch the polarity of the power supply;
the monitoring and control system is arranged remote from the railway switch; and/or
the switch machine includes at least one sensor adapted to detect the first and/or the second end position, wherein the at least one sensor adapted to provide a predetermined output voltage at an output if the points are at the first and/or second end position, wherein the output of the at least one sensor is connected to the monitoring module at a respective input, wherein the monitoring module is adapted to record the values provided by the at least one current sensor and the at least one voltage sensor in response to detecting a change of the input voltage.

According to a further aspect, the method for monitoring a switch machine, wherein a power supply is providing a current to a switch motor of the switch machine, the switch motor being adapted to move points of the railway switch, wherein a relay having a primary contact connected electrically to the power supply via at least one line and a secondary contact being electrically connected to the switch motor; the relay being adapted to switch on and off the power provided to the switch motor, wherein the relay includes at least one control contact, the at least one control contact being adapted to be connected to a controller adapted to control the relay with an input voltage, wherein the at least one control contact is connected to the monitoring module via a respective input, the method comprising:

monitoring at least one control contact of the relay;
in response to detecting a change of the input voltage:
measuring the voltage at the line between the relay and the power supply;
measuring the current of at least one line between the relay and the power supply;
storing the measured voltage and the measure current values;
analyzing the measured voltage and the measured current So that the manner in which the above recited features of the present invention can be understood in detail, a more particular description of the invention, briefly summarized above, may be read by reference to embodiments. The accompanying drawings relate to embodiments of the invention and are described in the following:

FIG. 1 is a schematic drawing of a system for controlling a railway switch;

FIG. 3 shows a processing chain of a voltage sensor;

FIG. 4 shows a flow chart of a method according to an embodiment disclosed herein.

Figure 2:
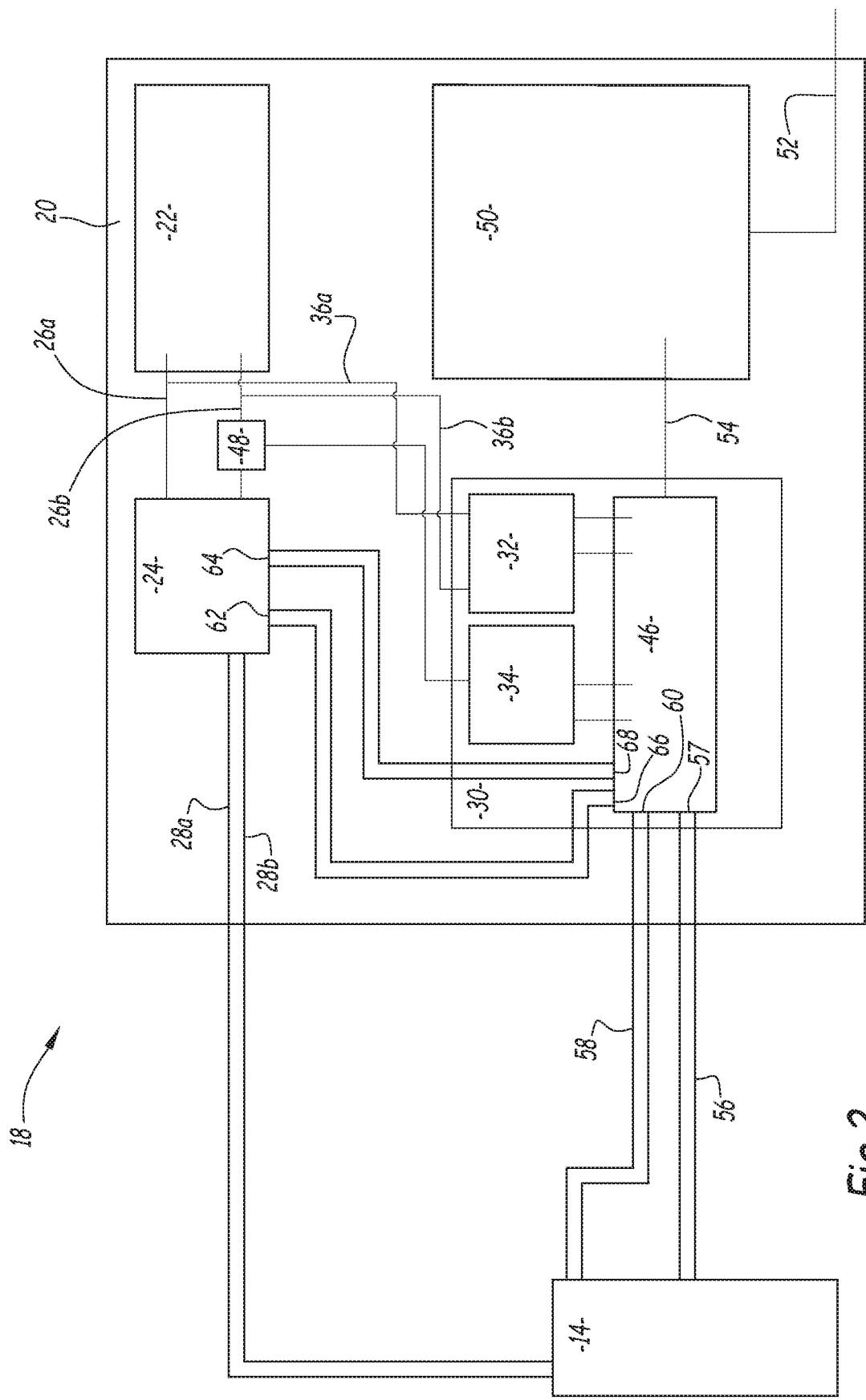
FIG. 2 is a schematic drawing of a device according to an embodiment of the invention.

FIG. 1 shows schematically a system 1 for controlling a railway switch 3. A railway switch 3 is a device for guiding railway vehicles from a first track to a second track 7, 9 at a railway junction. The railway switch 3 includes a pair of linked rails, which are preferably tapered. The linked rails, also denominated as points, are lying between diverging outer rails 12. The points 10 can be moved laterally or orthogonal to the movement direction of the railway vehicle across the railway switch 3 between two end positions. At a first end position, one of the points 10 is in contact with a first one of the outer rails 12, and at a second end position, the other one of the points 10, is in contact with the second one of the outer rails 12.

The points 10 are moved by a switch machine 14, which may include a motor 16. According to an embodiment, the motor 16 is a DC motor.

The switch 3, and in particular the motor 16, are controlled by a control and monitoring device 18. The control and monitoring device 18 is, for example, located remotely from the railway tracks 5, 7, 9. In an embodiment, the control and monitoring device 18 is located in a wayside bungalow 20.

In an embodiment, the control and monitoring device 18 is connected to a power supply grid (not shown). In another embodiment, the control and monitoring device 18 is connected to a local power source, for example a battery provided in the wayside bungalow 20.

The control and monitoring device 18 is adapted to provide power to the motor 16 of the switch machine 14 and to receive measurements from one or more sensors of the switch machine 14. In some embodiments, the one or more sensors are detecting the end positions of the points 10, the movement direction of the points 10, and/or the actual position of the points 10. For example, sensor outputs of the end positions of the points 10 may be called normal status indicator and reverse status indicator. The one or more sensor outputs, for example the normal status indicator for the first end position and the reverse status indicator for the second end position, for the end positions are provided, for example, as a DC voltage. For example the sensor for the end position may be contacts, which are only closed, when the points 10 are in the end position. In other words, if a DC current is fed into the circuit with the sensor, the DC voltage is present in the output only when the points 10 are in the respective end position. In case the points 10 are not in the end position, the output of the end position sensor will be zero, as the contacts are open.

According to an embodiment, the current provided by the control and monitoring device 18 to the motor 16 directly drives the motor 16. In other words, the driving direction and the speed depend directly on the current provided by the control and monitoring device 18.

For that purpose, a power supply unit 22, for example connected to a power grid or a battery, provides electrical energy to the switch machine 14, in particular via a relay 24, which is controlled by a controller (not shown in FIG. 2). According to an embodiment, the power supply unit 22 is a power converter, for example a DC/DC converter or an AC/DC converter. The power supply unit 22 provides the current via lines 26a, 26b and lines 28a, 28b to the switch machine 14. For example the power supply unit 22 may provide a DC (direct current) current, in particular a 24V or a 110V DC current. In other embodiments, an AC (alternating current) current may be used to supply the switch machine 14 with energy, for example a 110 VAC current.

The relay 24 is adapted to switch on and off the current provided by the power supply unit 22. In an embodiment, the relay 24 is adapted to switch both lines 26a, 26b. Further, the relay is adapted to switch the polarity of the lines 26a, 26b. In other words, the relay has primary contacts connected electrically to the power supply via the lines 26a, 26b and secondary contacts connected to the switch motor 16 via lines 28a, 28b.

The control and monitoring device 18 includes further a monitoring module 30. The control and monitoring device 18 may also include more than one monitoring module 30, for example it may include two, three, four or more monitoring modules 30.

The monitoring module 30 includes, in an embodiment, at least one voltage sensor 32 and/or at least one current sensor 34.

The voltage sensor 32 is electrically connected to the lines 26a, 26b between the power supply unit 22 and the switch machine 14, in particular between the power supply unit 22 and the relay 24. For example, the voltage sensor 32 is connected via lines 36a, 36b with the lines 26a, 26b respectively.

FIG. 3 shows in more detail an embodiment of the voltage sensor 32. The voltage sensor 32 includes low pass filters 38a, 38b, voltage isolation amplifiers 40a, 40b, an operational amplifier 42 and an analog to digital converter (ADC) 44. For example, in an embodiment, the ADC 44 converts the voltage into a 12 bit signal. In other embodiments also other data rates may be used. The ADC may be located in a processor, for example the processor 46 of the monitoring module 30. The voltage isolation amplifiers 40a, 40b provide a galvanic separation between the DC supply of the power supply unit 22 and the voltage sensor 32. For example, the voltage isolation amplifiers 40a, 40b may use an inductive coupling, a capacitive coupling or an optical coupling. The current sensor 34 is connected to a current transducer 48, in particular a non-invasive current transducer 48. An example of a non-invasive current transducer for a DC current is a Hall Effect sensor. According to an embodiment, the current transducer 48 generates an output voltage proportional to the current passing through the current transducer 48. The output voltage of the current transducer 48 is used as an input of an ADC in the current sensor 34. For example, in an embodiment, the ADC in the current sensor 34 converts the voltage into a 12 bit signal. In other embodiments also other data rates may be used. In other embodiments, the ADC may be located in a processor, for example the processor 46 of the monitoring module.

In some embodiments, the current sensor has a similar structure as the voltage sensor. In other words, the current sensor includes a low pass filter, a voltage isolation amplifier, an operational amplifier and the ADC connected in series.

According to an embodiment, the processor 46 of the monitoring module 30, comprises at least two inputs for voltage measurements of one or more voltage sensors 32 and at least two inputs for current measurements of one or more current sensors 34, for example, in case if more than one railway switch should be monitored.

Thus, the monitoring module 30 is adapted to monitor both current and voltage in an isolated manner at a remote site, which is remote from the railway track and/or the railway switch 3. In other words, the monitoring does not affect the safety of the control and monitoring device 18 or interfere with the railway switch performance.

The processor 46 is adapted to forward the measured voltages and currents to a data aggregation device 50, which may be connected via an network connection 52, for example Ethernet connection, to a remote central computer, for example an interlocking. The network connection 52 may be also a wireless network connection. The monitoring module 30 is connected with the aggregation device 50 with a network connection 54, for example an Ethernet connection or a serial connection.

Further, as already indicated above, the switch machine 14 is configured to provide sensor outputs to the monitoring module 30. For example, an output of the normal status indicator and a reverse status indicator are provided. The output is provided, for example, as a DC voltage. In an embodiment, a first pair of lines 56 is connected to an input 57 of the processor 46 via a galvanic isolator to provide an indication of the reverse status and a second pair of lines 58 is connected to a further input 60 of the processor 46 to provide an indication of the normal status. For example, the galvanic isolator, which may be arranged in the monitoring and control system, may be an opto-coupler.

This sensor output signals are for example monitored, to determine if a switch machine is out of alignment or there is some other problem.

In an embodiment, the relay 24 includes one or more coils for switching one or more poles. The one or more coils are energized by a control tension provided by the controller mentioned here-above. In other embodiments also a solid state relay may be used. The control tension is applied via control contacts 62, 64 to the relay 24. The control tension is for example a DC voltage. According to an embodiment, the control tension applied to the control contacts 62, 64 is also monitored by the monitoring module 30 by connecting the control contacts 62, 64 in parallel to inputs 66, 68 of the processor 46, in particular via a galvanic isolator, for example an opto-coupler.

For example, the inputs 57, 60, 66, 68 of the processor 46 are provided with an ADC. The ADC 44 and the ADC at the inputs 57, 60, 66, 68 of the processor have a sampling period of 15 to 1000 microseconds, in particular 50 to 600 microseconds. According to an embodiment, the inputs 57, 60, 66, 68 of the processor 46 are monitored continuously. For example, in case one of the input voltages applied to the inputs 57, 60, 66, 68 is changed above or below a specific voltage threshold, the processor 46 is adapted to start capturing or recording the samples provided by the current and voltage sensors 32, 34.

The monitoring device 30 forwards the measured voltages from the inputs 57, 60, 66, 68 to the aggregation device 50, like for the voltages and currents measured via the voltage and current sensors 32, 34, in particular in case the processor 46 has started with capturing the samples provided by the current and voltage sensors 32, 34.

According to an embodiment, it is thus possible to determine the voltage and current that the switch machine motor 16 consumes, for example by the aggregation device 50.

In an embodiment, the aggregation device 50 is adapted to apply a time stamp to the received data from the processor 46

Further, according to an embodiment, the aggregation device 50 is adapted to perform analytics and to store the captured information in a log. Further, the aggregation device 50 is adapted to recreate the voltage and current waveforms of the current provided to the switch machine. 14. For example, it is possible to track a degradation of the switch or an obstruction.

FIG. 4 shows a flow chart of a method according to an embodiment. In a first step 100, the monitoring device 30 monitors at least one control contact of the relay. If a change of the voltage applied to the relay is detected, then the monitoring device 30 starts to record the current values and the voltage values provided by the current and voltage sensors 32, 34 (step 102). In other embodiments, the monitoring device 30 always records the current values and the voltage values at a first sampling rate, and if a change of the voltage applied to the relay is detected, then the monitoring device 30 record the current values and the voltage values provided by the current and voltage sensors 32, 34 at a second sampling rate, which is higher than the first sampling rate.

The voltage values and the current values, as well as the measured values at the inputs 57, 60, 66, 68 of the monitoring device 30 are then provided to the aggregation device 50.

In step 104, a time stamp is applied to the recorded current values and voltage values provided by the sensors 32, 34 and/or to the measured values at at least one of the inputs 57, 60, 66, 68 of the monitoring device 30. For example, the time stamp is applied at the aggregation device 50. The aggregation device 50 stores then the received values with the associated time stamps in a data base.

In step 106, the current and voltage values stored in the database are analyzed, in particular to determine the function or malfunctioning of the railway switch. In addition, values of the end position sensors outputs of the switch machine and the control voltage applied to the control contacts of the relay 24 are analyzed in addition. For example, the values stored may be used to perform predictive diagnostics.

The invention claimed is:

1. Control and monitoring device for a switch machine of a railway switch comprising:
   a power supply for providing a switch motor of the switch machine with a current, the switch motor being adapted to move points of the railway switch, a relay having a primary contact connected electrically to the power supply via at least one line and a secondary contact adapted to be electrically connected to the switch motor;

the relay being adapted to switch on and off the power provided to the switch motor;

at least one current sensor adapted to sense the current to be provided to the switch motor at the at least one line between the power supply and the relay;

at least one voltage sensor adapted to sense a voltage to be provided to the switch motor at the at least one line between the power supply and the relay;

a processor connected to the at least one current sensor and the at least one voltage sensor, wherein the processor is adapted to record the measured current and voltage values;

wherein, the recorded current and voltage values are stored in a database to be analyzed to determine the function or malfunction of the railway switch and to perform predictive diagnostics.

2. Control and monitoring device for the switch machine according to claim 1, wherein the current sensor is electrically connected to a current transducer adapted to detect the current to be provided.

3. Control and monitoring device for the switch machine according to claim 2, wherein the current transducer is galvanically separated from the at least one line between the power supply and the relay.

4. Control and monitoring device for the switch machine according to claim 2, wherein the current transducer is a Hall Effect sensor.

5. Control and monitoring device for the switch machine according to claim 2, wherein the current transducer is adapted to provide a voltage corresponding to the current flowing in the at least one line.

6. Control and monitoring device for the switch machine according to claim 1, wherein the voltage sensor includes at least one galvanic separation to separate the at least one line from the processor.

7. Control and monitoring device for the switch machine according to claim 6, wherein the galvanic separation is a voltage isolation amplifier.

8. Control and monitoring device for the switch machine according to claim 1, wherein the relay is adapted to switch the polarity of the power supply.

9. Control and monitoring device for the switch machine according to claim 1, further including a controller adapted to control the relay.

10. Control and monitoring device according to claim 1, wherein the control and monitoring device is adapted to be arranged remotely from the railway switch.

11. Control and monitoring device according to claim 1, wherein the relay includes at least one control contact, the at least one control contact being adapted to be connected to a controller adapted to control the relay with an input voltage, wherein the at least one control contact is connected to the processor at a respective input, wherein the processor is adapted to record the values provided by the at least one current sensor and the at least one voltage sensor in response to detecting a change of the input voltage.

12. System comprising:
a railway switch having a switch machine including a switch motor, the switch motor being adapted to move points of the railway switch between a first position and a second position; and
a control and monitoring device for a switch machine of the railway switch including:
a power supply adapted to provide the switch motor with a current,
a relay having a primary contact connected electrically to the power supply via at least one line and a secondary contact being electrically connected to the switch motor, the relay being adapted to switch on and off the power provided to the switch motor;
at least one current sensor adapted to sense the current to be provided to the switch motor at the at least one line between the power supply and the relay;
at least one voltage sensor adapted to sense a voltage to be provided to the switch motor at the at least one line between the power supply and the relay;
a processor connected to the at least one current sensor and the at least one voltage sensor, wherein the processor is adapted to record the measured current and voltage values;
wherein, the recorded current and voltage values are stored in a database to be analyzed to determine the function or malfunction of the railway switch and to perform predictive diagnostics.

13. System according to claim 12, wherein the current sensor is electrically connected to a current transducer adapted to detect the current to be provided.

14. System according to claim 13, wherein the current transducer is galvanically separated from the at least one line between the power supply and the relay.

15. System according to claim 12, wherein the voltage sensor includes at least one galvanic separation to separate the at least one line from the processor.

16. System according to claim 12, wherein the relay is adapted to switch the polarity of the power supply.

17. System according to claim 12, wherein the monitoring and control system is arranged remotely from the railway switch.

18. System according to claim 12, wherein the switch machine includes at least one sensor adapted to detect the first and/or the second position, wherein the at least one sensor is adapted to provide a predetermined output voltage at an output if the points are at the first and/or second position, wherein the output of the at least one sensor is connected to the processor at a respective input, wherein the processor is adapted to record the values provided by the at least one current sensor and the at least one voltage sensor in response to detecting a change of an input voltage.

19. Method for monitoring a switch machine, the method comprising:
monitoring at least one control contact of a relay;
in response to detecting a change of an input voltage:
measuring a voltage at least one line between the relay and a power supply;
measuring a current of the at least one line between the relay and the power supply;
storing the measured voltage and the measured current values; and
analyzing the measured voltage and the measured current values, wherein the recorded current and voltage values are stored in a database to be analyzed to determine the function or malfunction of the railway switch and to perform predictive diagnostics;
wherein the power supply is providing a current to a switch motor of the switch machine, the switch motor being adapted to move points of a railway switch,
wherein the relay having a primary contact connected electrically to the power supply via at least one line and a secondary contact being electrically connected to the switch motor; the relay being adapted to switch on and off the power provided to the switch motor, wherein the relay includes the at least one control contact, the at least one control contact being adapted to be connected to a controller adapted to control the relay with the input voltage, wherein the at least one control contact is connected to comprising a processor via a respective input.

\* \* \* \* \*